United States Patent
Lin et al.

(10) Patent No.: US 12,363,976 B2
(45) Date of Patent: *Jul. 15, 2025

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shih-Yao Lin, New Taipei (TW); Hsiao Wen Lee, Hsinchu (TW); Ya-Yi Tsai, Hsinchu (TW); Shu-Uei Jang, Hsinchu (TW); Chih-Han Lin, Hsinchu (TW); Shu-Yuan Ku, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/518,162

(22) Filed: Nov. 22, 2023

(65) Prior Publication Data
US 2024/0097007 A1    Mar. 21, 2024

Related U.S. Application Data

(63) Continuation of application No. 17/337,607, filed on Jun. 3, 2021, now Pat. No. 11,855,179.

(51) Int. Cl.
*H10D 64/01*    (2025.01)
*H10D 30/01*    (2025.01)
(Continued)

(52) U.S. Cl.
CPC ....... *H10D 64/017* (2025.01); *H10D 30/0243* (2025.01); *H10D 30/62* (2025.01); *H10D 62/124* (2025.01)

(58) Field of Classification Search
CPC ........... H01L 29/66545; H01L 29/0684; H01L 29/6681; H01L 29/785; H10D 64/017; H10D 30/62; H10D 62/124
See application file for complete search history.

(56) References Cited

U.S. PATENT DOCUMENTS 11,855,179 B2 * 12/2023 Lin .............. H01L 29/6681
2020/0020794 A1 * 1/2020 Lin .............. H01L 23/5329
(Continued)

*Primary Examiner* — Christine A Enad
(74) *Attorney, Agent, or Firm* — FOLEY & LARDNER LLP

(57) ABSTRACT

A semiconductor device is described. An isolation region is disposed on the substrate. A plurality of channels extend through the isolation region from the substrate. The channels including an active channel and an inactive channel. A dummy fin is disposed on the isolation region and between the active channel and the inactive channel. An active gate is disposed over the active channel and the inactive channel, and contacts the isolation region. A dielectric material extends through the active gate and contacts a top of the dummy fin. The inactive channel is a closest inactive channel to the dielectric material. A long axis of the active channel extends in a first direction. A long axis of the active gate extends in a second direction. The active channel extends in a third direction from the substrate. The dielectric material is closer to the inactive channel than to the active channel.

20 Claims, 17 Drawing Sheets

(51) Int. Cl.
*H10D 30/62* (2025.01)
*H10D 62/10* (2025.01)

(56) References Cited

U.S. PATENT DOCUMENTS

2020/0098758 A1\* 3/2020 Lin ................... H01L 29/7848
2020/0328207 A1 10/2020 Hong et al.
2021/0408263 A1 12/2021 Lin et al.

\* cited by examiner

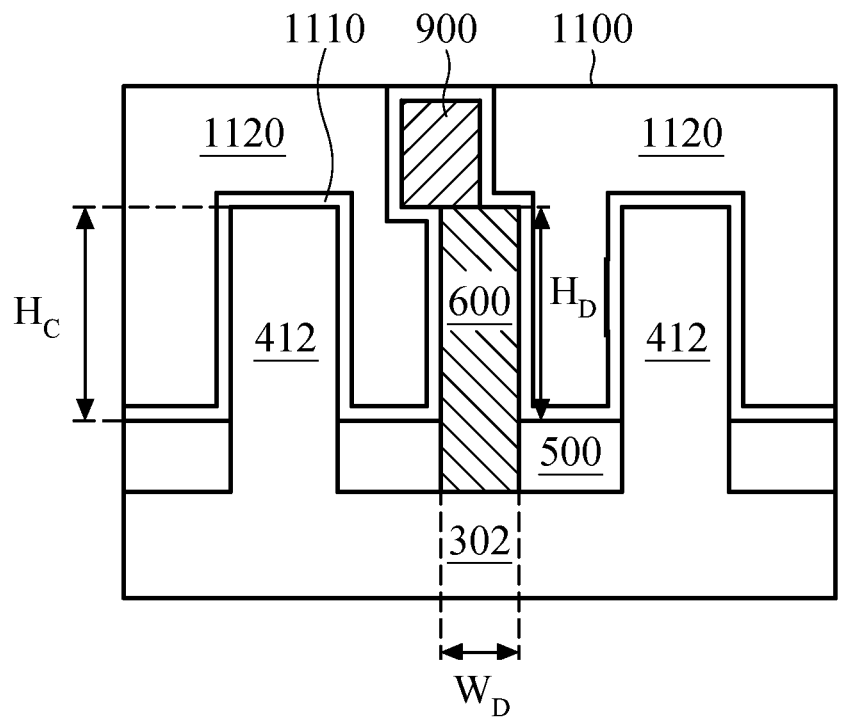
FIG. 11
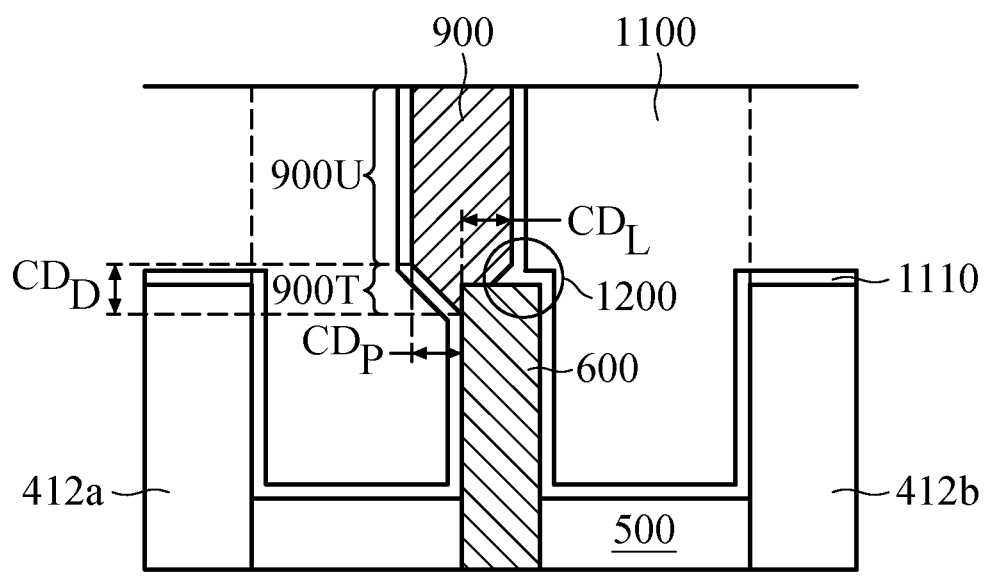
FIG. 12A
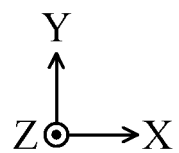

SEMICONDUCTOR DEVICES AND METHODS OF MANUFACTURING THEREOF

CROSS-REFERENCE TO RELATED APPLICATIONS

This application is a continuation of U.S. patent application Ser. No. 17/337,607, filed Jun. 3, 2021, entitled "SEMICONDUCTOR DEVICES AND METHODS OF MANUFACTURING THEREOF," which is incorporated herein by reference in its entirety for all purposes.

BACKGROUND

This disclosure relates generally to a semiconductor device, and in some embodiments, to transistor devices that include providing a cut dummy gate with metal gate refill.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-7, 9-11, 12A, 12B and 12C illustrate cross-sectional views cut along a direction (X-X) of FIG. 1 with the gate, during various fabrication stages in accordance with some embodiments.

DETAILED DESCRIPTION

Figure 1:
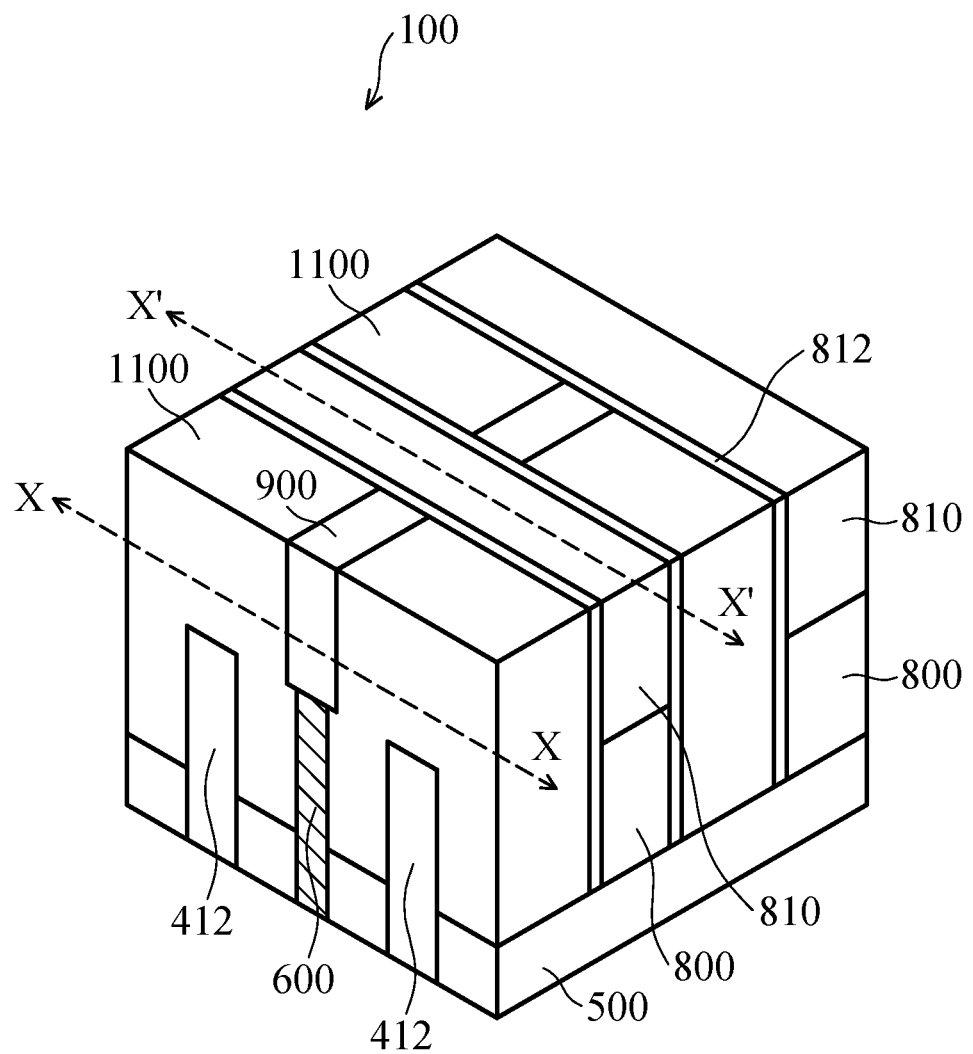
FIG. 1 is a perspective view illustrating a semiconductor device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as field effect transistors ("FETs"), are fabricated on a single wafer. Non-planar transistor device architectures, such as fin-based transistors (typically referred to as "FinFETs"), can provide increased device density and increased performance over planar transistors. Some advanced non-planar transistor device architectures, such as nanosheet (or nanowire) transistors, can further increase the performance over the FinFETs. When compared to the FinFET where the channel is partially wrapped (e.g., straddled) by a gate structure, the nanosheet transistor, in general, includes a gate structure that wraps around the full perimeter of one or more nanosheets for improved control of channel current flow. For example, in a FinFET and a nanosheet transistor with similar dimensions, the nanosheet transistor can present larger driving current (Ion), smaller subthreshold leakage current (Ioff), etc. Such a transistor that has a gate structure fully wrapping around its channel is typically referred to as a gate-all-around (GAA) transistor of GAAFET.

The present disclosure provides various embodiments of a semiconductor device, which may include a FinFET, GAAFET, or nanosheet FET (NSFET) transistor. Embodiments of the present disclosure are discussed in the context of forming a non-planar transistor, such as a FinFET, GAAFET, or NSFET transistor, and in particular, in the context of a semiconductor device. A substrate is provided. An isolation region is disposed on the substrate. A plurality of channels extend through the isolation region from the substrate. The channels including an active channel and an inactive channel. A dummy fin is disposed on the isolation region and between the active channel and the inactive channel. An active gate is disposed over the active channel and the inactive channel, and contacts the isolation region. A dielectric material extends through the active gate and contacts a top of the dummy fin. The inactive channel is a closest inactive channel to the dielectric material. A long axis of the active channel extends in a first direction. A long axis of the active gate extends in a second direction. The active channel extends in a third direction from the substrate. The dielectric material is closer to the inactive channel than to the active channel.

A semiconductor device as described can provide advantages. According to some embodiments, the dielectric material for gate cut may be closer to the inactive channel than to the active channel. Since the inactive channel does not need a real gate to allow for control of the semiconductor device, the space on the inactive channel side may be reduced and the space on the active channel side may correspondingly be increased. Thus, the metal gate fill process (forming the gate 1100) window may be enlarged increasing device yield and performance.

FIG. 1 is a perspective view illustrating the semiconductor device showing the cross-sectional cuts within the gate 1100, and cross-sectional cuts outside the gate 1100. FIG. 1 illustrates the device 100 with S/D structures 800, ILD 810, substrate 302, conducting gate 1100, dielectric material 900, isolation regions 500, fins 412, and dummy fin 600.

Figure 2:
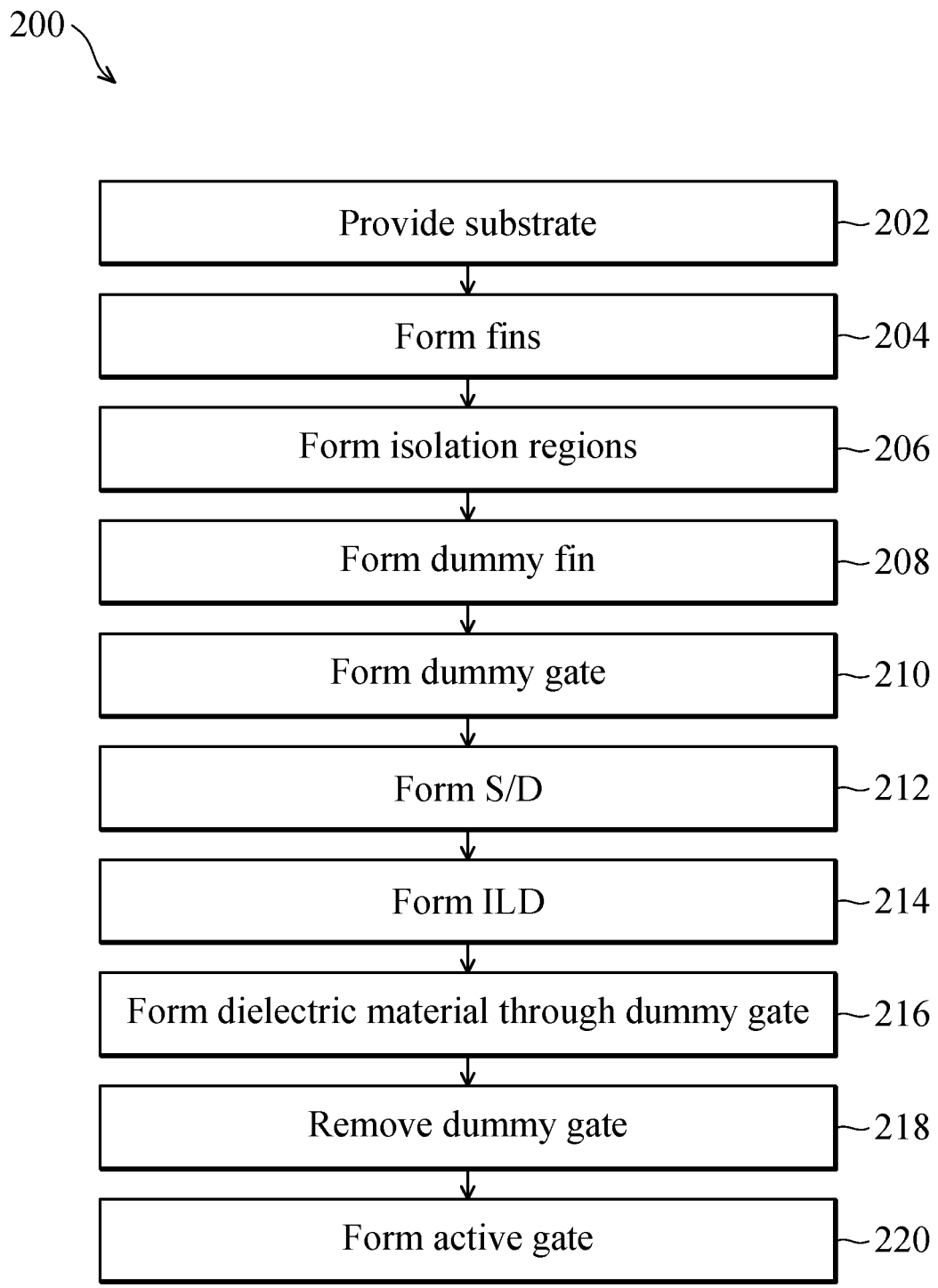
FIG. 2 illustrates a flow chart of an example method to make a semiconductor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET (or a GAA) transistor device. Further, the method 200 can be used to form a FinFET transistor (or GAA transistor) device in a respective conduction type such as, for example, an n-type transistor device or a p-type transistor device. The term "n-type," as used herein, may be referred to as the conduction type of a transistor having electrons as its conduction carriers, and the term "p-type," as used herein, may be referred to as the conduction type of a transistor having holes as its conduction carriers.

FIG. 2 illustrates a flowchart of a method 200 to form a semiconductor device according to one or more embodiments of the present disclosure. It is noted that the method 200 is merely an example, and is not intended to limit the present disclosure. In some embodiments, the semiconductor device includes, at least part of, a fin field-effect-transistor (FinFET), but can include any of various other transistors (e.g., a GAAFET, a nanosheet field-effect-transistor) while remaining within the scope of the present disclosure.

Referring to FIG. 2, the method 200 starts with operation 202 in which a semiconductor substrate is provided. The method 200 continues to operation 204 in which fins are formed. Then in operation 206 an isolation region is formed. Continuing to operation 208, a dummy fin is formed. Continuing to operation 210, a dummy gate is formed. Continuing to operation 212, S/D structures are formed. Continuing to operation 214 an interlayer dielectric (ILD) is formed. Continuing to operation 216, a dielectric material is formed through the dummy gate. Continuing to operation 218, the dummy gate is removed. Continuing to operation 220 a conducting gate is formed.

In the following discussions, the operations of the method 200 may be associated with views of a semiconductor device 100 at various fabrication stages. In some embodiments, the semiconductor device 100 may be a FinFET. In other embodiments the semiconductor device 100 may be a GAAFET or nanosheet FET (NSFET).

Figure 3:
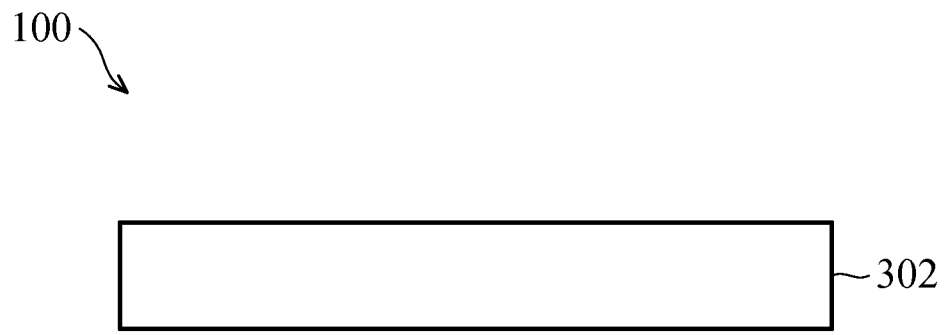

Corresponding to operation 202 of FIG. 2, FIG. 3 is a view of the semiconductor device 100 including a substrate 302 at one of the various stages of fabrication, according to some embodiments. In some embodiments, the substrate 302 is covered by a photo-sensitive layer and is patterned to subsequently form one or more fins (which may be channels in the final device) of the semiconductor device, which will be discussed in the following operations.

For a FinFET structure, the substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
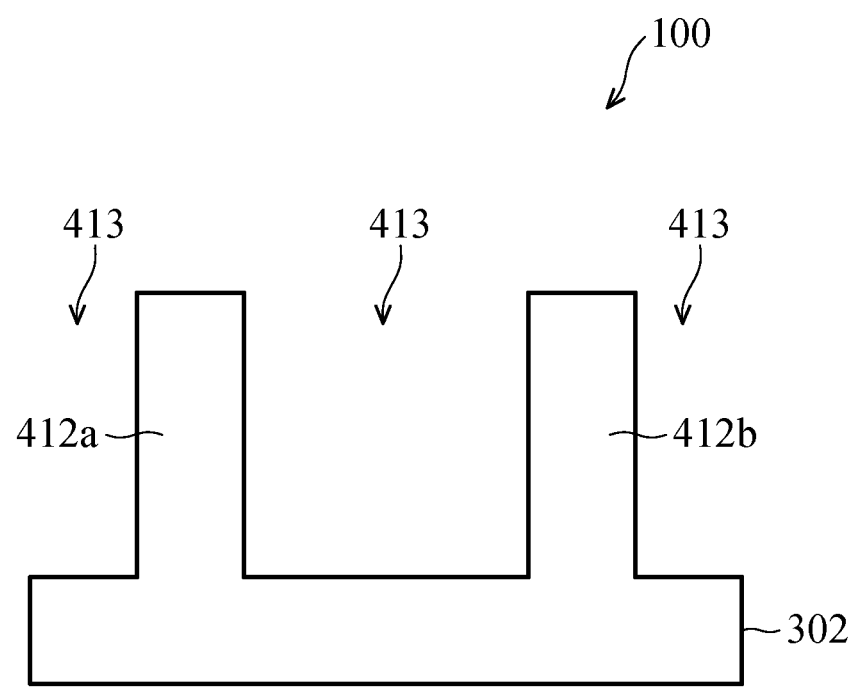

Corresponding to operation 204 of FIG. 1, FIG. 4 is a view of the semiconductor device 100 including a plurality of fins 412 at one of the various stages of fabrication, according to some embodiments, where fins 412a correspond to an inactive channel, and fins 412b correspond to an active channel. As shown, trenches 413 are disposed between adjacent fins 412. It is noted that although two fins 412 are shown in the illustrated embodiments of FIG. 4 (and the following figures), any desired number of fins may be formed on the semiconductor substrate 302. As such, when multiple fins are formed on the substrate 302 that are in parallel with one another, the fins can be spaced apart from one another by a corresponding trench 413.

The fins 412 may be formed by a photolithographic process, for example. A photo-sensitive layer may be patterned in a photolithographic process, for example, and may be used as an etch mask to etch the substrate 302 to form fins 412 and trenches 413 between the fins 412, in the substrate 302. Portions of the semiconductor substrate 302 sandwiched between the trenches 413 are thus formed as fins 412. The fins 412 each extend upward from a surface of the substrate 302. The trenches 413 may be strips (viewed from the top of the semiconductor device 100) parallel to each other, and closely spaced with respect to each other. After the fins 412 are formed, the photo-sensitive layer may be removed. Subsequently, a cleaning process may be performed to remove a native oxide of the semiconductor substrate 302. The cleaning may be performed using diluted hydrofluoric (DHF) acid, or the like, for example.

The inactive fin 412a (inactive channel) may be arranged in a polysilicon diffusion edge (PODE) region (where there is dummy gate polysilicon (PO) at the FIN edge) as described below. The active fin 412b (active channel) may be arranged in an active region corresponding to a Non-PODE region as described below. In some embodiments the inactive fin 412a may be arranged in a Non-PODE region. The reference character 412 refers to a fin generically, while the reference characters 412a and 412b refer to an inactive fin and active fin, respectively.

Figure 5:
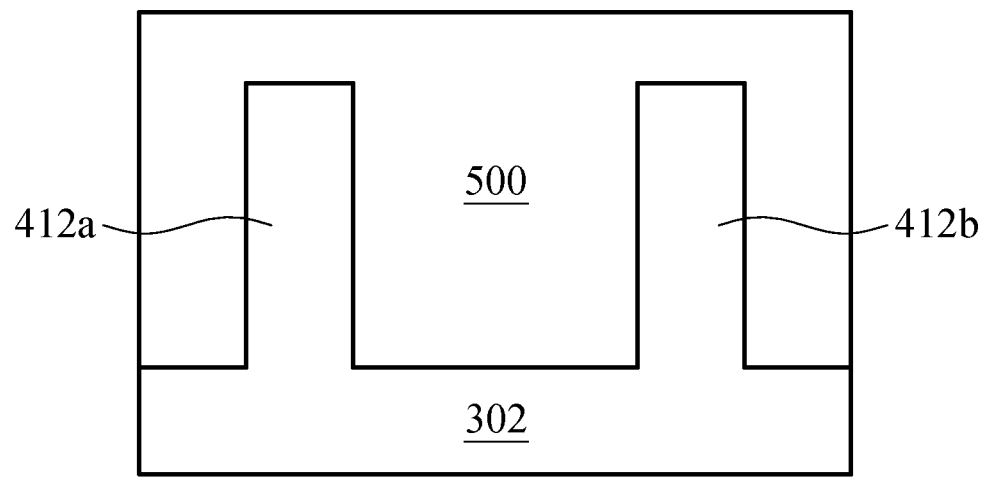

Corresponding to operation 206 of FIG. 2, FIG. 5 is a view of the semiconductor device 100 including isolation regions 500 at one of the various stages of fabrication, according to some embodiments. The isolation regions 500, which are formed of an insulation material, such as a dielectric, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 500 and a top surface of the fins 412 that are coplanar (not shown).

In some embodiments, the isolation region 500 include a liner, e.g., a liner oxide (not shown), at the interface between each of the isolation regions 500 and the substrate 302 (fins 412). In some embodiments, the liner oxide is formed to reduce crystalline defects at the interface between the substrate 302 and the isolation region 500. Similarly, the liner oxide may also be used to reduce crystalline defects at the interface between the fins 412 and the isolation region 500. The liner oxide (e.g., silicon oxide) may be a thermal oxide formed through a thermal oxidation of a surface layer of the substrate 302, although other suitable methods may also be used to form the liner oxide.

Figure 6A:
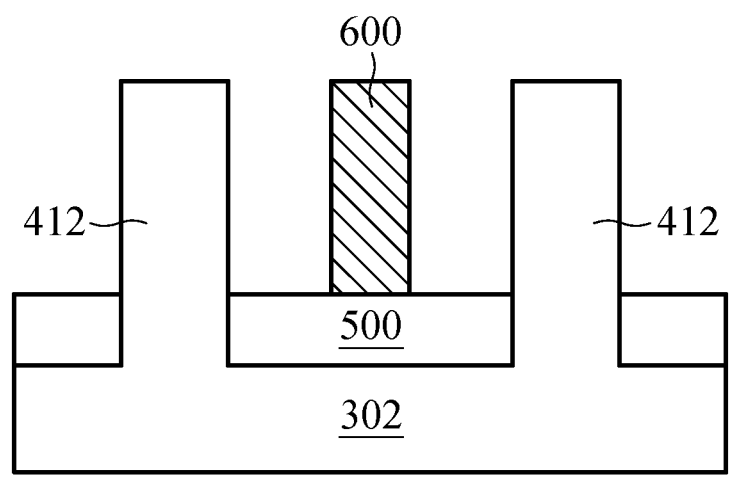

Corresponding to the operation 208 of FIG. 2, FIG. 6A illustrates a view of the semiconductor device 100 including a dummy fin 600 at one of the various stages of fabrication, according to some embodiments. The dummy fin 600 may be formed in the isolation region 500 between the inactive fin 412a and the active fin 412b. The dummy fin 600 may, in some embodiments, be formed in a recess in the isolation region 500 before the overall isolation region 500 is recessed to expose upper regions of the inactive fin 412a and the active fin 412b in formation of the STI regions 500. The recess may be formed by a photolithographic method including etching to form the recess. For example, the photolithographic method may include a dry etch or a wet etch using dilute hydrofluoric (DHF) acid to form the recess.

Next, the isolation regions 500 are recessed to form shallow trench isolation (STI) regions 500, as shown in FIG. 6A. The isolation regions 500 are recessed such that the upper portion of the fins 412 protrude from between neighboring STI regions 500. In other words, the fins 412 are protruded from a top surface of the STI regions 500. The top surface of the STI regions 500 may have a flat surface (as illustrated), a convex surface, a concave surface (such as dishing), or combinations thereof. The top surface of the STI regions 500 may be formed flat, convex, and/or concave by an appropriate etch. The isolation regions 500 may be recessed using an acceptable etching process, such as one that is selective to the material of the isolation regions 500. For example, a dry etch or a wet etch using dilute hydrofluoric (DHF) acid may be performed to recess the isolation regions 500.

The dummy fin 600 may be formed of a dummy fin material which is deposited in the recess, where excess dummy fin material is then removed such as by etching or polishing. The dummy fin material may be an insulating material, for example. The dummy fin material may include a material selected from the group consisting of silicon oxide, silicon nitride, silicon carbide, silicon oxycarbide, silicon oxynitride, silicon carbonitride, silicon oxycarbonitride, and combinations thereof. The dummy fin material may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. In some other embodiments, the dummy fin material may include a high-k dielectric material. As such, the dummy fin material may have a k value greater than about 4.0 or even greater than about 7.0, and may include a metal oxide or a silicate of Hf, Al, Zr, La, Mg, Ba, Ti, Pb, and combinations thereof. The dummy fin material may be TaN, TaO, $Al_2O_3$, or HfO, for example. The formation methods of such a high-k dummy fin material may include CVD molecular beam deposition (MBD), atomic layer deposition (ALD), PECVD, and the like. Excess dummy fin material is then removed such as by etching back or polishing.

Figure 6B:
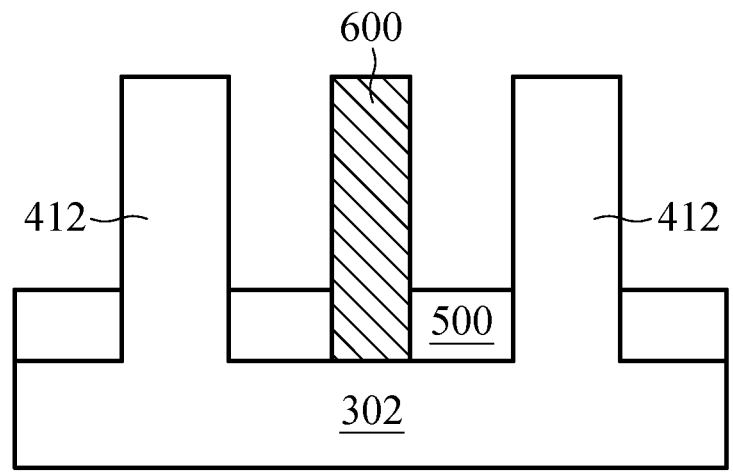

FIG. 6B illustrates an embodiment where the dummy fin 600 is formed to be embedded in the STI 500. In FIG. 6B a dummy fin material for the dummy fin 600 is formed in the region between the fins 412. The dummy fin 600 may be formed of the dummy fin material which is deposited in the region between the fins 412, where dummy fin material may then patterned such as by etching.

The isolation region 500 material is formed over the fins 412 and dummy fin 600. The isolation regions 500 may be formed of an insulating material in a similar manner as described with respect to FIG. 5.

A polishing process, such as CMP, may be performed to planarize and remove portions of the isolation regions 500, fins 412 and dummy fin 600. An etch back may be performed to remove upper portions of the isolation regions 500.

Figure 7:
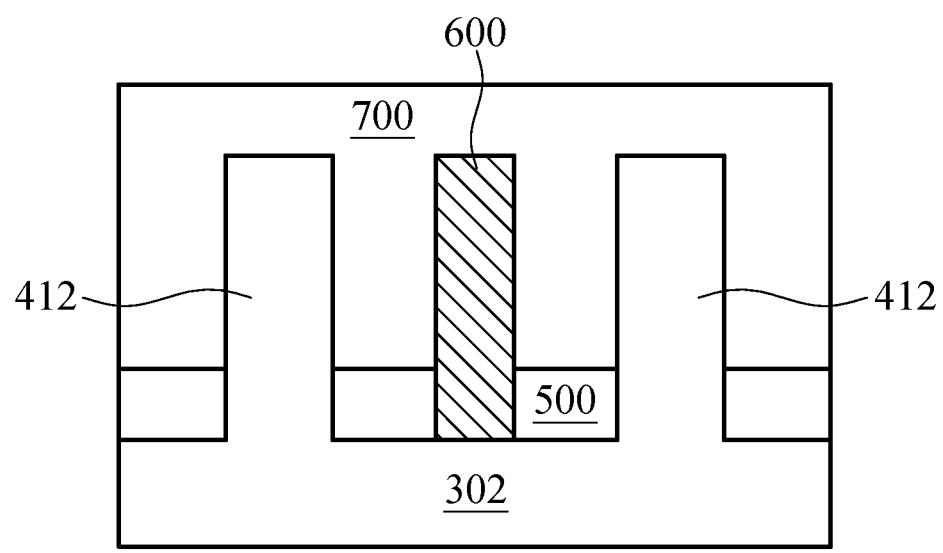

Corresponding to the operation 210 of FIG. 2, FIG. 7 illustrates views of the semiconductor device 100 including a dummy gate structure 700 at one of the various stages of fabrication, according to some embodiments.

The dummy gate structure 700 may be formed from a gate layer formed over the fins 412 and then planarized, such as by a CMP. A mask layer may be deposited over the gate layer. The gate layer may be formed of, for example, polysilicon, although other materials may also be used. The mask layer may be formed of, for example, silicon nitride or the like. After the layers (e.g., the gate layer, and the mask layer) are formed, the mask layer may be patterned using acceptable photolithography and etching techniques to form a mask. The pattern of the mask then may be transferred to the gate layer by an acceptable etching technique to form the dummy gate structure 700. The patterned dummy gate structure 700 has regions exposing each of the fins 412 for subsequent source/drain (S/D) structure formation.

Figure 8A:
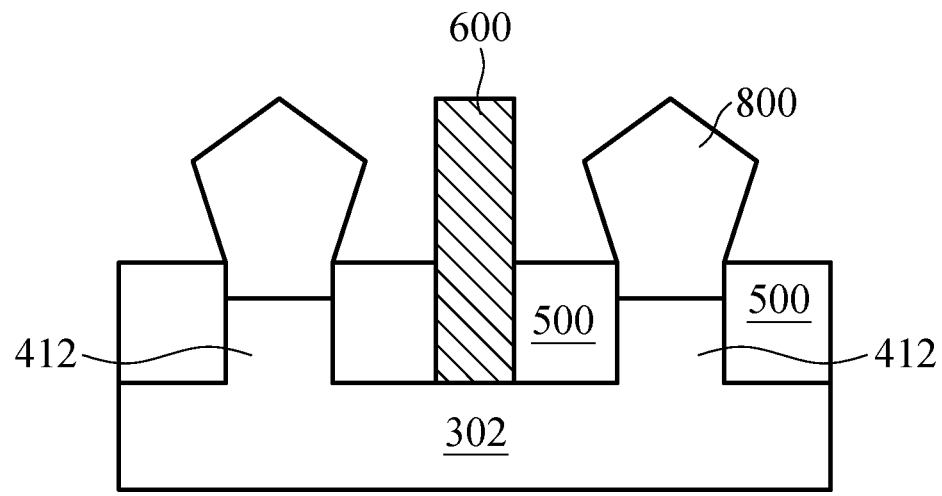
FIGS. 8A and 8B, illustrate cross-sectional views cut along a direction (X'-X') of FIG. 1, with the source/drain (S/D), i.e., without the gate of a semiconductor device, made by the method of FIG. 1, during various fabrication stages in accordance with some embodiments.

Corresponding to the operation 212 of FIG. 2, FIG. 8A is a view of the semiconductor device 100 in which S/D structures are epitaxially formed. The cross sectional view of FIG. 8A is cut within the S/D structures, and is a cross sectional view (along X'-X') parallel to that of FIG. 7, which is cut within the dummy gate structure 700.

The S/D structures 800 are formed by epitaxially growing a semiconductor material from the exposed portions of the fins 412. Various suitable methods can be used to epitaxially grow the S/D structures 800 such as, for example, metalorganic CVD (MOCVD), molecular beam epitaxy (MBE), liquid phase epitaxy (LPE), vapor phase epitaxy (VPE), selective epitaxial growth (SEG), the like, or combinations thereof.

In some embodiments, when the resulting semiconductor device 100 is an n-type FinFET, the S/D structures 800 may include silicon carbide (SiC), silicon phosphorous (SiP), phosphorous-doped silicon carbon (SiCP), or the like. When the resulting FinFET is a p-type FinFET, the S/D structures 800 may include SiGe, and a p-type impurity such as boron or indium.

Figure 8B:
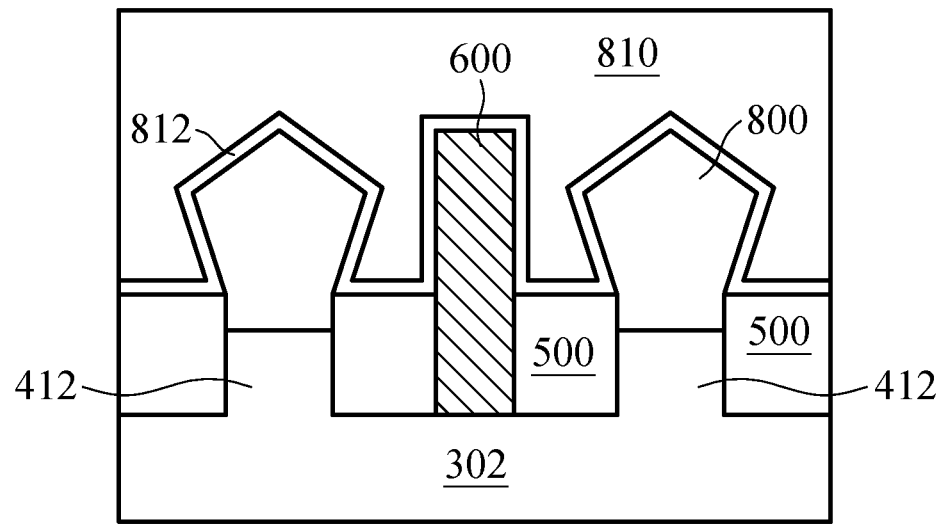

Corresponding to the operation 214 of FIG. 2, FIG. 8B is a view of the semiconductor device 100 in which an interlevel dielectric (ILD) 810 is formed at one of the various stages of fabrication, according to some embodiments. FIG. 8B illustrates a cross sectional view which is cut within the S/D structures 800 in a similar fashion to FIG. 8A. The ILD 810 is formed over the fins 412 and the S/D structures 800, and is formed in holes in the dummy gate structure 700. The ILD 810 may be formed over an etch stop layer (ESL) (812). In some embodiments, the ILD 810 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 810 is formed, a planarization process, such as a CMP process, may be performed to achieve a level upper surface for the ILD 810. After the planarization process, the upper surface of the ILD 810 can be level with the upper surface of the dummy gate structure 600, in some embodiments.

Corresponding to the operation 214 of FIG. 2, FIG. 8B is a view of the semiconductor device 100 in which an interlevel dielectric (ILD) 810 is formed at one of the various stages of fabrication, according to some embodiments. FIG. 8B illustrates a cross sectional view which is cut within the S/D structures 800 in a similar fashion to FIG. 8A. The ILD 810 is formed over the fins 412 and the S/D structures 800, and is formed in holes in the dummy gate structure 700. The ILD 810 may be formed over an etch stop layer (ESL) (812). In some embodiments, the ILD 810 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 800 is formed, a planarization process, such as a CMP process, may be performed to achieve a level upper surface for the ILD 810. After the planarization process, the upper surface of the ILD 810 can be level with the upper surface of the dummy gate structure 600, in some embodiments.

Figure 9:
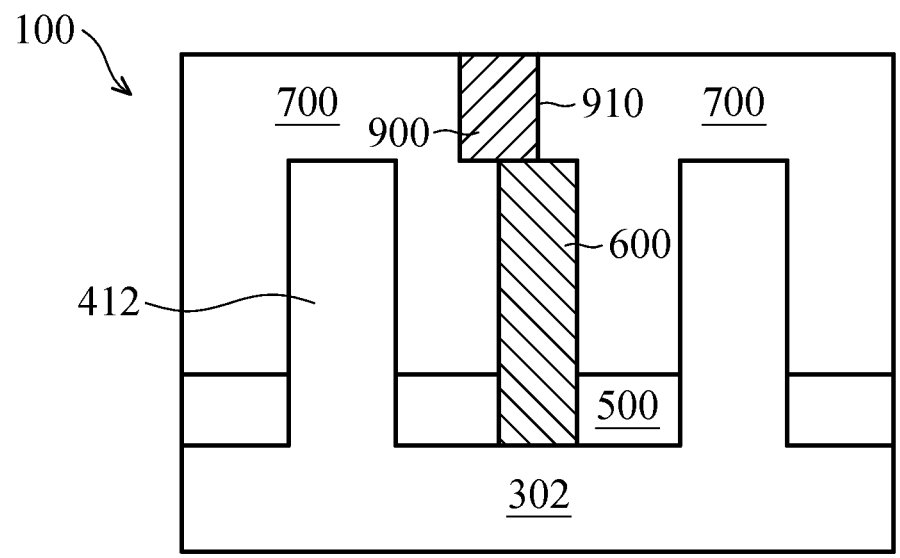

Corresponding to the operation 216 of FIG. 1, FIG. 9 is a view of the semiconductor device 200 in which a dielectric material is formed through the dummy gate 700 at one of the various stages of fabrication, according to some embodiments. FIG. 9 illustrates a cross sectional view which is cut within the gate structures.

The dummy gate 700 may be etched using an etch mask to form a hole 910 extending from a top surface of the dummy gate 700 to the dummy fin 600, or in some embodiments from a top surface of the dummy gate 700 to the isolation structure 500. The dummy gate 700 may be etched by an appropriate etchant, and may be etched using RIE, for example. The hole 910 along with the dummy fin 500 separate regions of the dummy gate 700.

A dielectric material 900 is formed in the hole 910. The dielectric material 900 may be, for example, silicon oxide, silicon nitride, silicon oxynitride, silicon carbide, silicon carbonitride, silicon oxycarbonitride, silicon oxycarbide, multilayers thereof, or the like. The dielectric material 900 can be formed by depositing the dielectric material in the hole 910 using any suitable method, such as CVD, PECVD, or FCVD. The dielectric material 900 may be planarized, such as by CMP to remove the dielectric material 900 from a top surface of the dummy gate 700, if needed.

Figure 10:
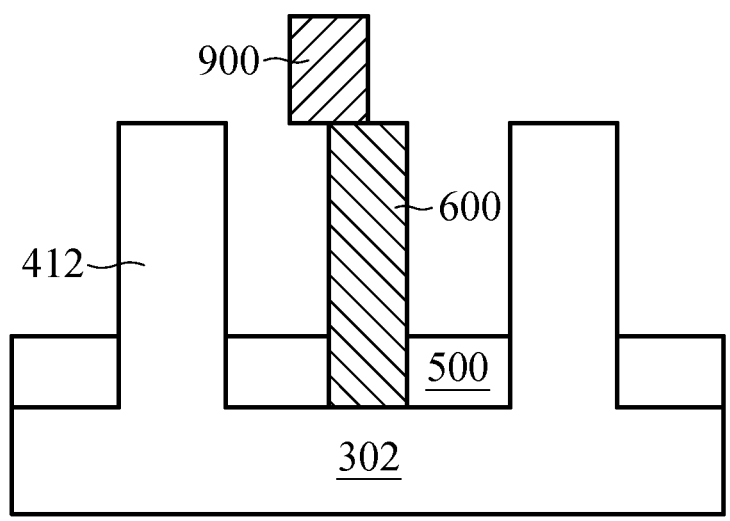

Corresponding to the operation 218 of FIG. 2, FIG. 10 is a view of the semiconductor device 100 in which the dummy gate 700 is removed. The dummy gate 700 may be removed, for example, by an appropriate etch. For example, one or more isotropic etching processes may be performed.

The gate electrode 1120 may include a stack of multiple metal materials. For example, the gate electrode 1120 may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

The gate electrode 1120 may include a stack of multiple metal materials. For example, the gate electrode 1120 may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

FIG. 11 illustrates the height $H_C$ of the fins (channels) 412 above the isolation regions 500. FIG. 11 further illustrates the height $H_D$ of the dummy fin 600 above the isolation regions 500, and the width $W_D$ of the dummy fin 600. $W_D$ may be in the range of 0.5 to 50 nm. $H_D$ may be in the range of 5 to 150 nm. $H_C$ may be greater than, equal to, or less than $H_D$.

Figure 12B:
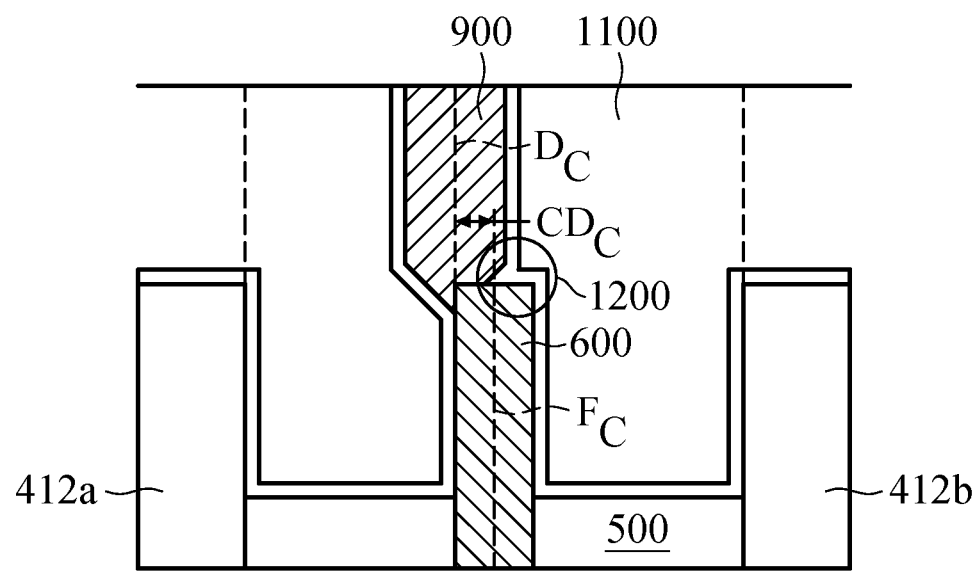
Figure 12C:
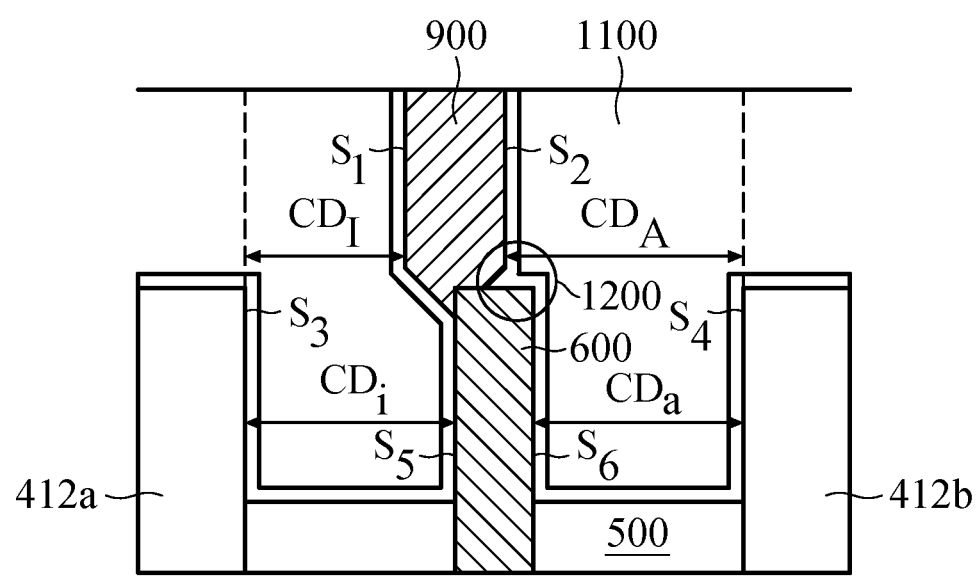

FIGS. 12A, 12B and 12C are cross sections illustrating the semiconductor device 100 according to some embodiments illustrating some distance parameters. FIGS. 12A, 12B and 12C illustrate a portion of the semiconductor device 100 including the gate 1100 which may be an active gate, the dummy fin 600, the inactive fin (channel) 412a, the active fin (channel) 412b, and the isolation regions 500. In FIGS. 12A, 12B and 12C, the dielectric material 900 extends through the gate 1100 and contacts a top of the dummy fin 600. The inactive channel 412a is a closest inactive channel to the dielectric material 900. A long axis of the active channel 412b extends in a first direction (out of the page Z direction). A long axis of the gate 1100 extends in a second direction (left to right X direction). The second direction may be perpendicular to the first direction. The active channel 412b extends in a third direction (vertical Y direction) from the substrate 302. The third direction may be perpendicular to the first and second directions. The disclosure is not limited to the first, second and third directions being perpendicular to each other. The dummy fin 600 and the dielectric material 900 may include a gap portion 1200, as shown in FIGS. 12A-12C, that separates, at least partially, a top of the dummy fin 600 from a bottom of the dielectric material 900.

Referring back to FIGS. 12A, 12B and 12C, the dielectric material 900 has an upper region 900U and a tapered region 900T below the upper region 900U. The upper region 900U has a first side $S_1$ and a second side $S_2$ opposite to the first side $S_1$. The first side $S_1$ is closer to the inactive channel 412a than to the active channel 412b in the second direction. The upper region 900U may be wider than the tapered region 900T in the second direction in some embodiments, may have the same width, or may be less wide.

The gate 1100 may have a third side $S_3$ contacting the inactive channel 412a, and a fourth side $S_4$ contacting the active channel 412b. The dummy fin 600 may have a top side, a fifth side $S_5$ facing the inactive channel 412a, and a sixth side $S_6$ opposite to the fifth side $S_5$.

The gate 1100 may have a third side $S_3$ contacting the inactive channel 412a, and a fourth side $S_4$ contacting the active channel 412b. The dummy fin 600 may have a top side, a fifth side $S_5$ facing the inactive channel 412a, and a sixth side $S_6$ opposite to the fifth side $S_5$.

Reference is made to FIG. 12A. According to some embodiments, a protrusion dimension $CD_P$ is a distance from the first side to the fifth side in the second direction. The protrusion dimension $CD_P$ may be in range of about 0.5 nm to about 50 nm. According to some embodiments, a landing dimension $CD_L$ is a distance from the second side to the fifth side in the second direction. The landing dimension $CD_L$ may be in range of 0.5 nm to 50 nm. According to some embodiments, a protrusion depth $CD_D$ is a depth in the third direction of the lower tapered region 900T. The protrusion depth $CD_D$ may be in a range of 0.3 nm to 100 nm.

Reference is made to FIG. 12B. According to some embodiments the dielectric material 900 has a first center line Dc extending along an axis of the dielectric material 900 in the third direction. The dummy fin 600 has a second center line Fc along an axis of the dummy fin 600 in the third direction. An offset $CD_C$ is a distance between the first center line and the second center line in the second direction, and may be in the range of 0.5 nm to 50 nm, for example.

Reference is made to FIG. 12B. According to some embodiments the dielectric material 900 has a first center line DL extending along an axis of the dielectric material 900 in the third direction. The dummy fin 600 has a second center line DF along an axis of the dummy fin 600 in the third direction. An offset $CD_C$ is a distance between the first center line and the second center line in the second direction, and may be in the range of 0.5 nm to 50 nm, for example.

Figure 13:
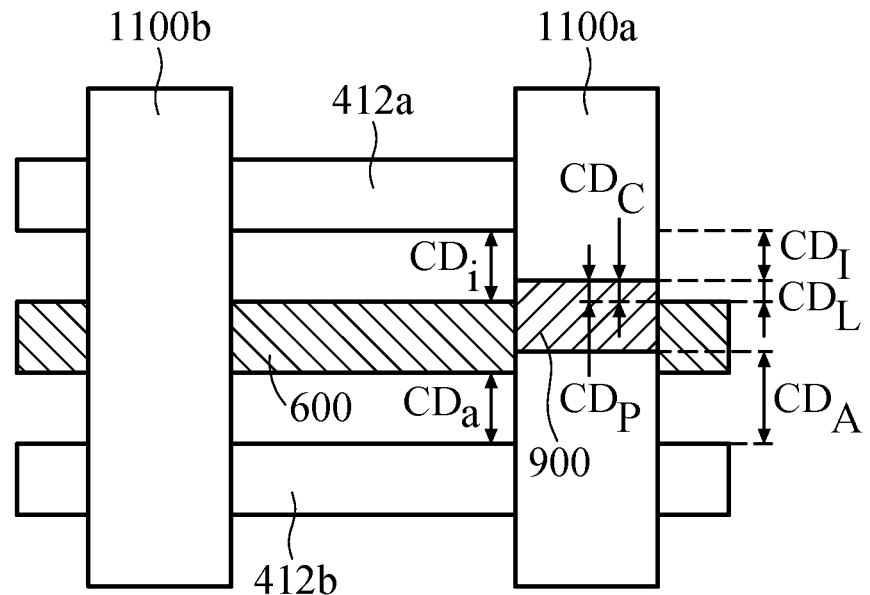
FIGS. 13, 14A and 14B are top views illustrating arrangements of the channels and gates according to some embodiments.

FIG. 13 is a top view of the semiconductor device 100 illustrating the parameters of FIGS. 12A-12C. In a corresponding fashion to FIGS. 12A-12C, FIG. 13 illustrates the gate 1100a which may be an active gate, the dummy fin 600, the inactive fin (channel) 412a, the active fin (channel) 412b, and dielectric material 900. In FIG. 13 the dielectric material 900 extends into the gate 1100 showing a cut gate structure where regions of the gate 1100a are separated, but regions of gate 1100b are not. FIG. 13 likewise to FIGS. 12A-12C illustrates the parameters of protrusion dimension $CD_P$, landing dimension $CD_L$, offset $CD_C$, as well as parameters $CD_A$, $CD_I$, $CD_a$, and $CD_i$.

Figure 14A:
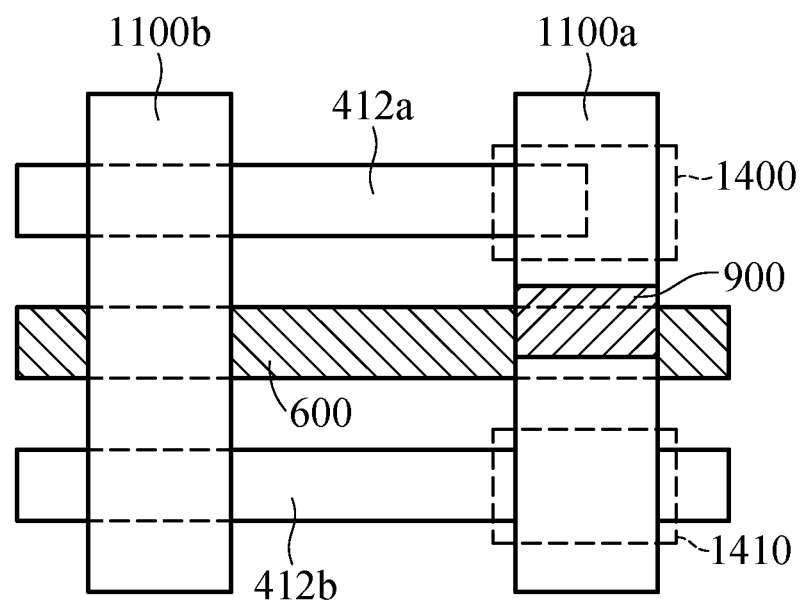

FIG. 14A is a top view of the semiconductor device 100 according to some embodiments similar to FIG. 13 but illustrating the PODE region 1400 and the non-PODE region 1410. In the PODE region 1400 the inactive fin 412a (inactive channel) does not extend past the gate 1100a, while in the non-PODE region 1410, the active fin 412b extends past the gate 1100a.

Figure 14B:
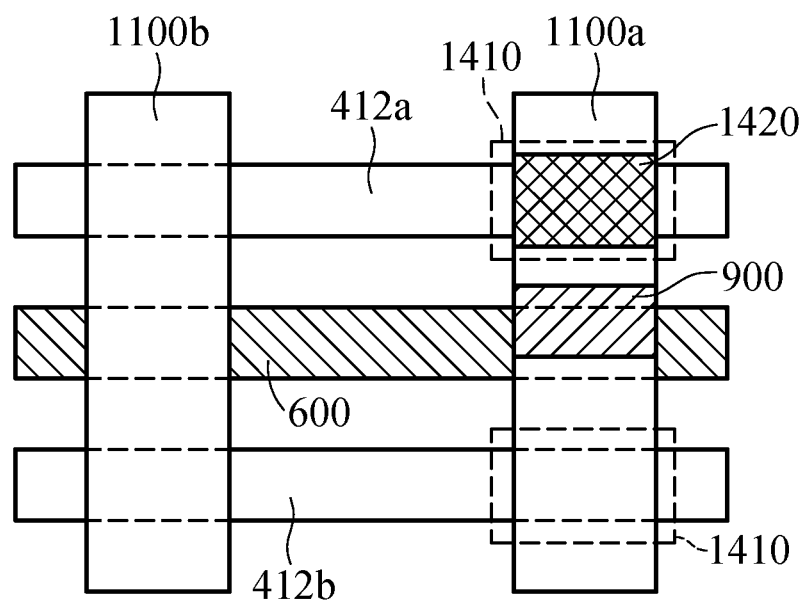

FIG. 14B is a top view of the semiconductor device 100 according to some embodiments where the inactive fin 412a (inactive channel) is formed on either side of the gate 1100a in a cut channel method where a dielectric fill 1420 extends through the gate 1100a separating portions of the inactive channel 412a. Thus, in FIG. 14B, the inactive channel 412a is in a non-PODE region 1410 at the point where the dielectric fill 1420 extends through the gate 1100a. In this case, both the inactive channel 412a and the active channel 412b are in non-PODE regions 1410.

The dielectric fill 1420 may include a material selected from the group consisting of silicon oxide, silicon nitride, silicon carbide, silicon oxycarbide, silicon oxynitride, silicon carbonitride, silicon oxycarbonitride, and combinations thereof, for example.

Figure 15:
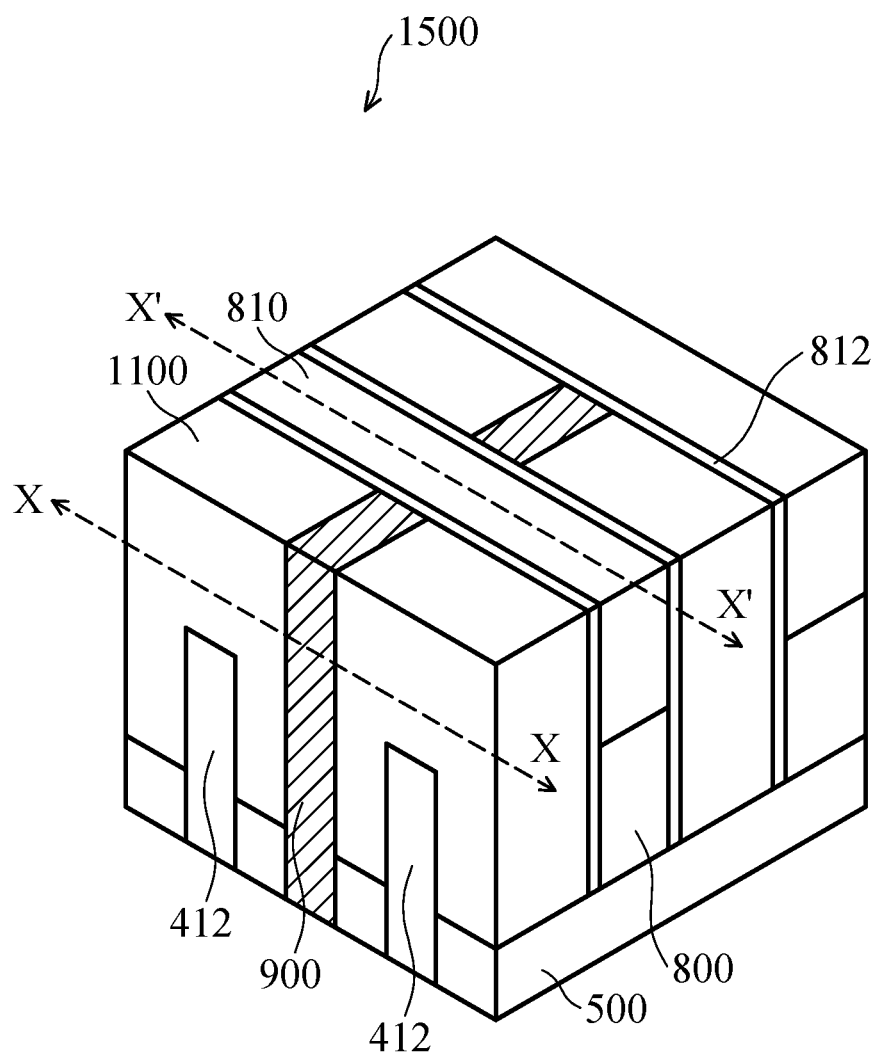
FIG. 15 is a perspective view illustrating another semiconductor device according to some embodiments.

FIG. 15 illustrates a semiconductor device 1500 according to some embodiments. FIG. 15 differs from the semiconductor device 100 of FIG. 1 in that no dummy fin is formed between the inactive channel 412a and the active channel 412b. Rather, the dielectric material 900 extends from a top of the gate 1100 to the dielectric isolation structure 500 separating the gate 1100 into separate regions.

Figure 16:
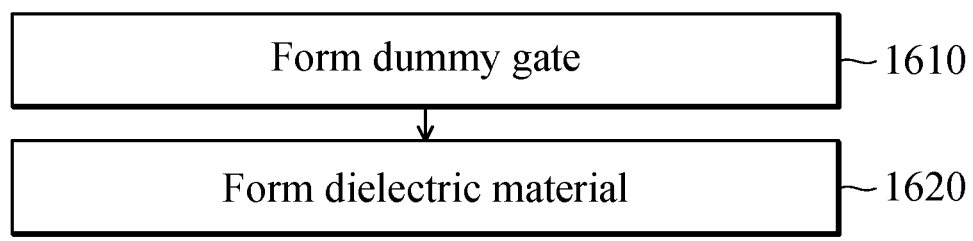
FIG. 16 illustrates a flow chart of an example method illustrating steps for forming a dielectric material in making a semiconductor device, in accordance with some embodiments.
Figure 17A:
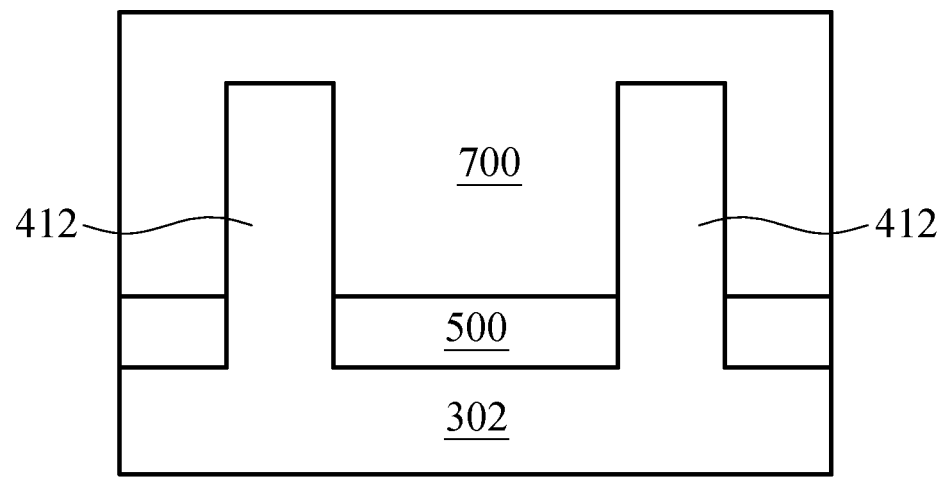
FIGS. 17A and 17B illustrate cross-sectional views cut along a direction (X-X) of FIG. 15 with the gate, during various fabrication stages in accordance with some embodiments.

FIG. 16 is a flow chart illustrating the formation of the dielectric material 900 to form the semiconductor device 1500. Corresponding to the operation 1610 of FIG. 16, FIG. 17A is a view of the semiconductor device 1500 in which the dummy gate 700 is formed. The dummy gate 700 may be formed in the same manner described with respect to step 210 of FIG. 2 except that there is no dummy fin to be formed upon.

Figure 17B:
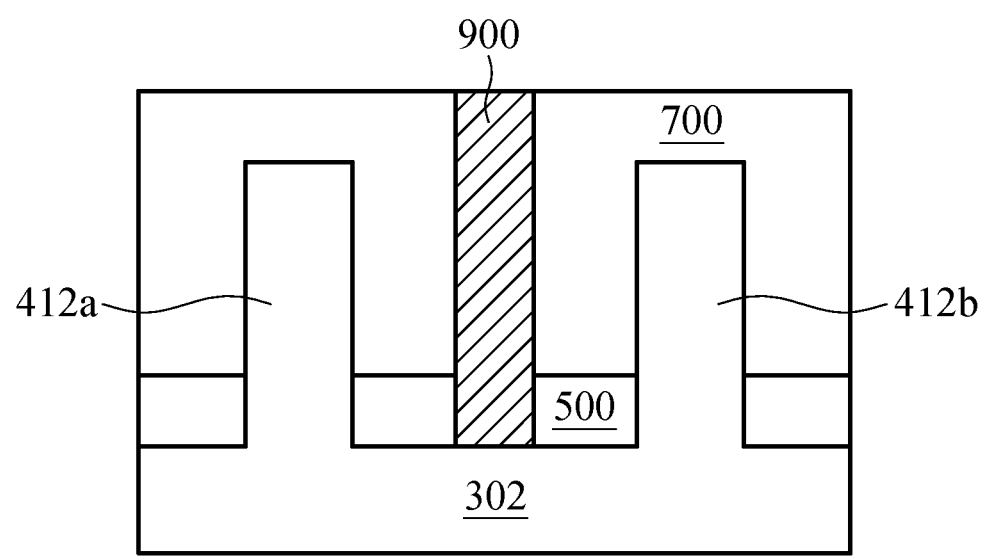

Corresponding to the operation 1620 of FIG. 16, FIG. 17B is a view of the semiconductor device 100 in which the dielectric material 900 is formed. The dielectric material 900 may be formed in the same manner described with respect to step 216 of FIG. 2 except that the dielectric material 900 is formed to contact the isolation region 500 separating the gate 1100 into separate regions.

In device 1500, the inactive channel 412a is a closest inactive channel to the dielectric material 900. A long axis of the active channel 412b extends in a first direction (out of the page Z direction). A long axis of the gate 1100 extends in a second direction (left to right X direction). The second direction may be perpendicular to the first direction. The active channel 412b extends in a third direction (vertical Y direction) from the substrate 302. The third direction may be perpendicular to the first and second directions. The dielectric material 900 extends in the third direction from the gate 1100 top surface to the isolation region 500 and is disposed between the active channel 412b and the inactive channel 412a. The dielectric material 900 may be closer to the inactive channel 412a than to the active channel 412b in the second direction. The distance from the dielectric material 900 to the inactive channel 412a is shown as $CD_I$ in FIGS. 18 and 19, while the distance from the dielectric material 900 to the active channel 412b is shown as $CD_A$. $CD_A$ may be greater than $CD_I$ in some embodiments. The distance from the dielectric material 900 to the inactive channel 412a in the second direction may be in the range of 1.0 nm to 500 nm, for example. $CD_A$ and $CD_I$ may be 1 nm to 500 nm, for example.

In device 1500, the inactive channel 412a is a closest inactive channel to the dielectric material 900. A long axis of the active channel 412b extends in a first direction (out of the page Z direction). A long axis of the gate 1100 extends in a second direction (left to right X direction). The second direction may be perpendicular to the first direction. The active channel 412b extends in a third direction (vertical Y direction) from the substrate 302. The third direction may be perpendicular to the first and second directions. The dielectric material 900 extends in the third direction from the gate 1100 top surface to the isolation region 500 and is disposed between the active channel 412b and the inactive channel 412a. The dielectric material 900 may be closer to the inactive channel 412a than to the inactive channel 412b in the second direction. The distance from the dielectric material 900 to the inactive channel 412a is shown as $CD_I$ in FIGS. 18 and 19, while the distance from the dielectric material 900 to the active channel 412b is shown as $CD_A$. $CD_A$ may be greater than $CD_I$ in some embodiments. The distance from the dielectric material 900 to the inactive channel 412a in the second direction may be in the range of 1.0 nm to 500 nm, for example. $CD_A$ and $CD_I$ may be 1 nm to 500 nm, for example.

Figure 18:
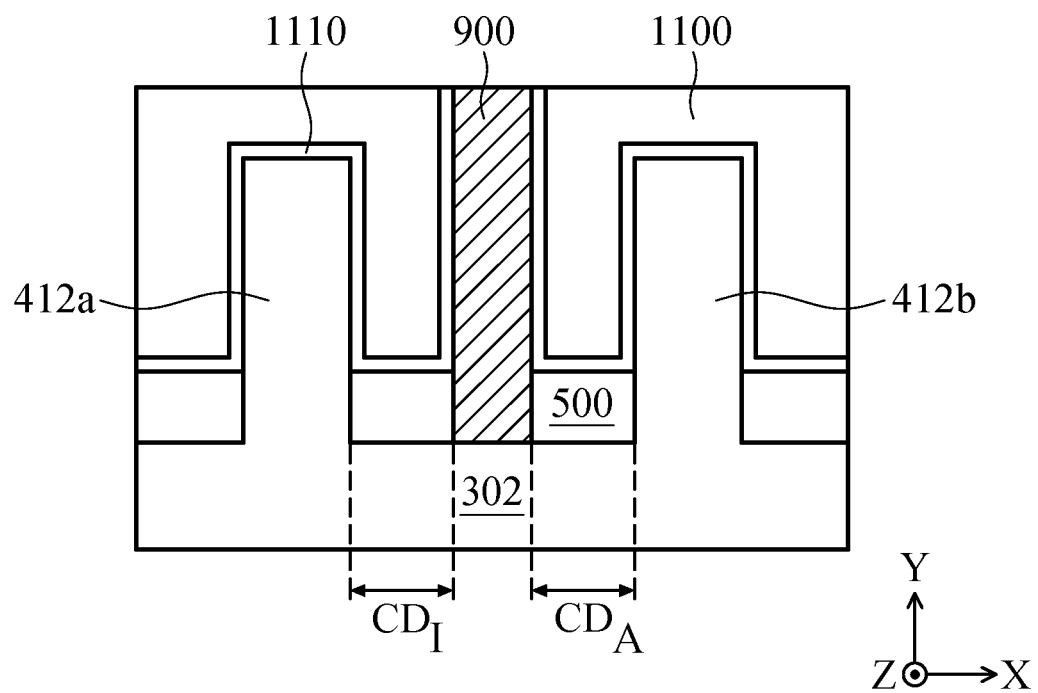
FIG. 18 illustrates a cross-sectional view similar to FIG. 17B, and including distance parameters in accordance with some embodiments.
Figure 19:
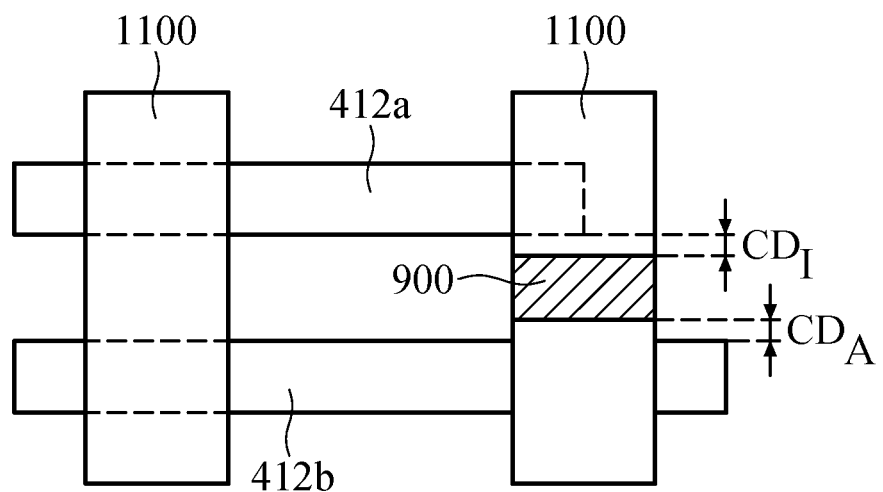
FIG. 19 is a top view illustrating an arrangement of the channels and gates according to some embodiments according to the arrangement of FIG. 18.

Embodiments according to FIGS. 18 and 19 do not include the dummy fin 600. Thus, in some cases, the number of process steps may be reduced.

Figure 20:
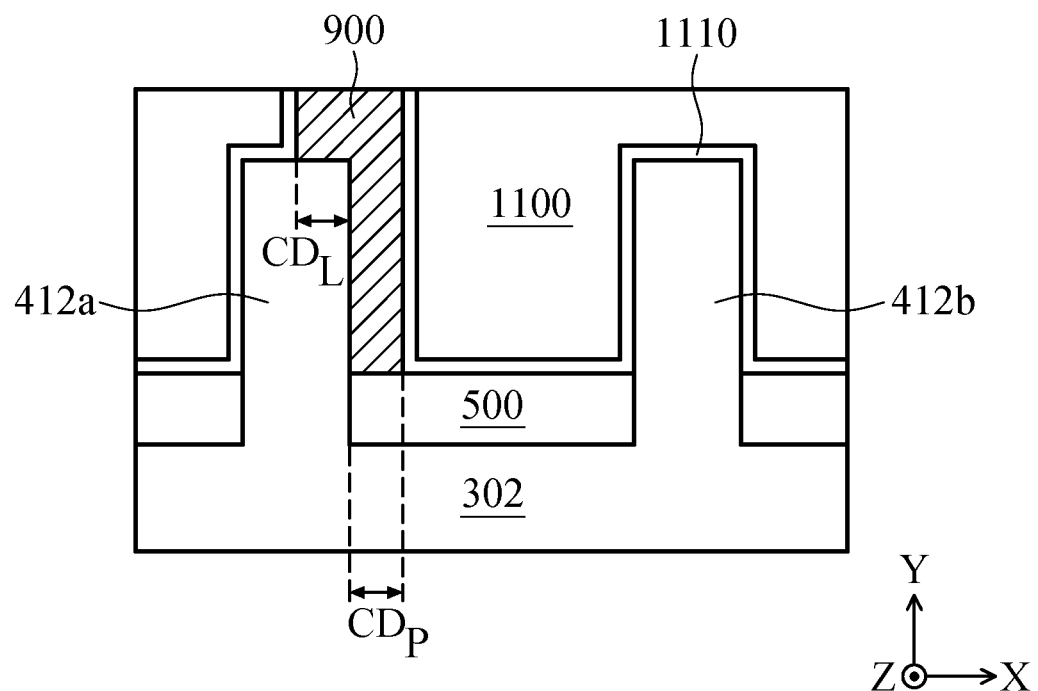
FIG. 20 illustrates a cross-sectional view cut along a direction (X-X) of FIG. 15 with the gate, in accordance with some embodiments.
Figure 21:
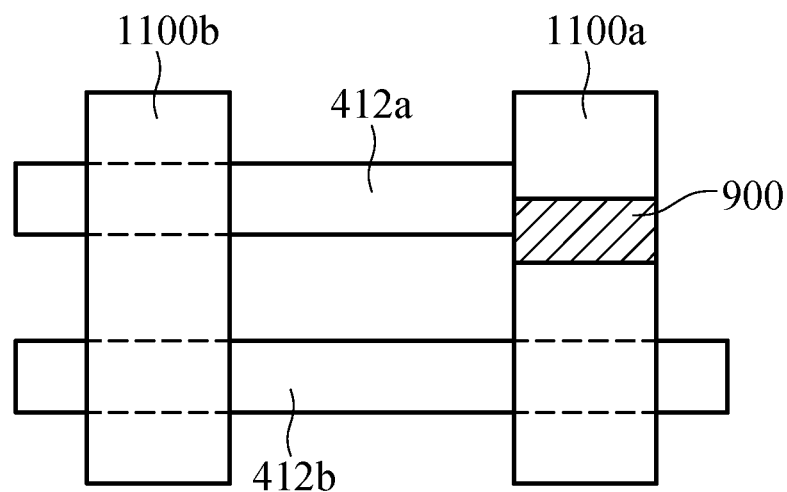
FIG. 21 is a top view illustrating an arrangement of the channels and gates according to some embodiments according to the arrangement of FIG. 20.

FIGS. 20 and 21 illustrate an arrangement where the dielectric material 900 contacts the inactive channel 412a. FIG. 20 is a cross sectional view of the semiconductor device 1500, and FIG. 21 is a top view of the device 1500 of FIG. 20. In some embodiments a width of the dielectric material 900 in the second direction is less than a width of the inactive channel 412a in the second direction.

According to some embodiments, and as shown in FIGS. 20 and 21, the dielectric material 900 has a landing dimension $CD_L$ which is a distance the dielectric material 900 covers the inactive channel 412a in the second direction, and a protrusion dimension $CD_P$ which is a distance the dielectric material 900 does not cover the inactive channel 412a in the second direction. The landing dimension $CD_L$ may be in the range of 0.5 nm to 50 nm, for example. The protrusion dimension $CD_P$ may also be in the range of 0.5 nm to 50 nm, for example.

In embodiments according to FIGS. 20 and 21 the dielectric material 900 contacts the inactive channel 412a. Thus, in some embodiments the space on the inactive channel side may be further reduced and the space on the active channel side may correspondingly be further increased. Thus, the metal gate fill process (forming the gate 1100) window may be further enlarged increasing device yield and performance.

Figure 22:
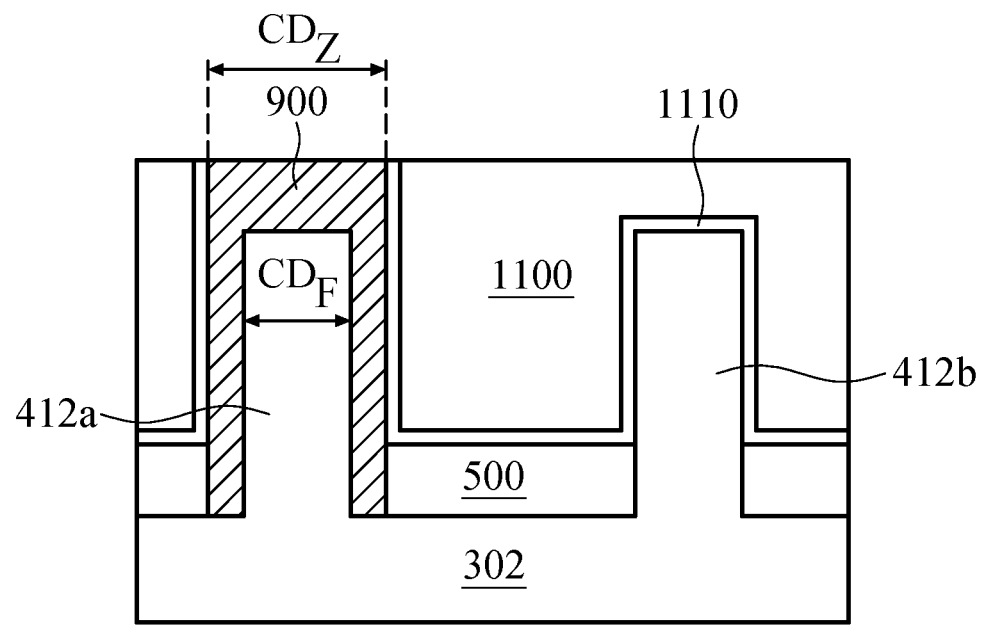
FIG. 22 illustrates a cross-sectional view cut along a direction (X-X) of FIG. 15 with the gate, in accordance with some embodiments.
Figure 23:
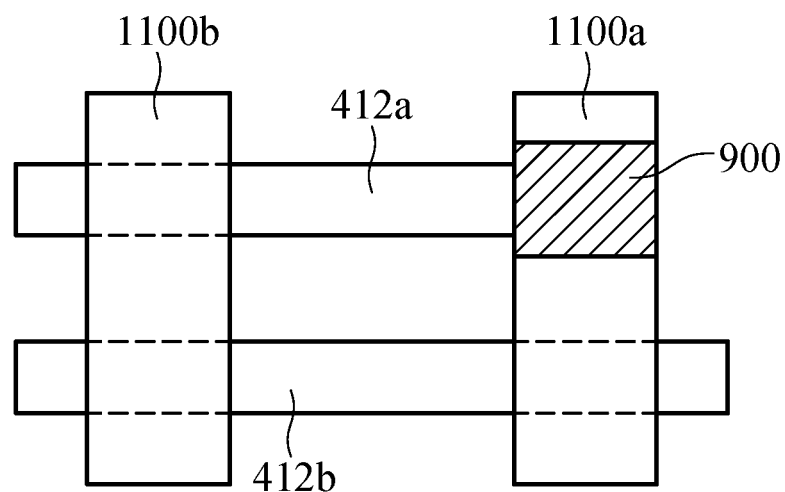
FIG. 23 is a top view illustrating an arrangement of the channels and gates according to some embodiments according to the arrangement of FIG. 22.

FIGS. 22 and 23 illustrate an arrangement where the dielectric material 900 contacts and completely covers the inactive channel 412a. FIG. 22 is a cross sectional view of the semiconductor device 1500, and FIG. 23 is a top view of the device 1500 of FIG. 22. A width $CD_Z$ of the dielectric material 900 in the second direction may be greater than a width of the inactive channel 412a in the second direction. The width of the dielectric material 900 may be in the range of 2 nm to 150 nm, for example. The width of the inactive channel 412a may be in the range of 2 nm to 100 nm, for example.

In embodiments according to FIGS. 22 and 23 the dielectric material 900 contacts and completely covers the inactive channel 412a. Thus in some cases the space on the inactive channel side may be further reduced and the space on the active channel side may correspondingly be further increased. Thus, the metal gate fill process (forming the gate 1100) window may be further enlarged increasing device yield and performance.

In one aspect of the present disclosure, a semiconductor device is disclosed. A substrate is provided. An isolation region is disposed on the substrate. A plurality of channels extend through the isolation region from the substrate. The channels including an active channel and an inactive channel. A dummy fin is disposed on the isolation region and between the active channel and the inactive channel. An active gate is disposed over the active channel and the inactive channel, and contacts the isolation region. A dielectric material extends through the active gate and contacts a top of the dummy fin. The inactive channel is a closest inactive channel to the dielectric material. A long axis of the active channel extends in a first direction. A long axis of the active gate extends in a second direction. The active channel extends in a third direction from the substrate. The dielectric material is closer to the inactive channel than to the active channel.

In another aspect of the present disclosure, a semiconductor device is disclosed. An isolation region is disposed on the substrate. A plurality of channels extend through the isolation region and from the substrate, the channels include an active channel and an inactive channel. An active gate is disposed over the active channel and the inactive channel, and contacts the isolation region. The inactive channel is a closest inactive channel to a dielectric material. A long axis of the active channel extends in a first direction. A long axis of the active gate extends in a second direction. The active channel extends in a third direction from the substrate. The dielectric material extends in the third direction from the active gate top surface to the isolation region and is disposed between the active channel and the inactive channel. The dielectric material is closer to the inactive channel than to the inactive channel in the second direction.

In another aspect of the present disclosure, a method of fabricating a semiconductor device is disclosed. A substrate is provided. A plurality of channels as fins are formed extending from the substrate. The channels include an active channel, and include an inactive channel. An isolation region is formed on the substrate. The channels extend through the isolation region. A dummy fin is formed on the isolation region and between the active channel and the inactive channel. An active gate is formed over the active channel and the inactive channel, and contacts the dielectric isolation structure. A dielectric material is formed extending through the active gate and contacting a top of the dummy fin. The inactive channel is a closest inactive channel to the dielectric material. The dielectric material is closer to the inactive channel than to the active channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a plurality of fins extending from the substrate, the fins including an active fin and an inactive fin spaced along a lateral direction;
   a dummy fin disposed between the active fin and the inactive fin;
   an active gate disposed over the active fin, the inactive fin, and the dummy fin; and
   a dielectric layer extending through the active gate to land on the dummy fin, wherein a first sidewall of the dielectric layer is between a sidewall of the dummy fin and a sidewall of the inactive fin along the lateral direction, and wherein a second sidewall of the dielectric layer opposite to the first sidewall is interposed between sidewalls of the dummy fin along the lateral direction.

2. The semiconductor device of claim 1, wherein the dielectric layer has an upper region and a lower region below and vertically aligned with the upper region.

3. The semiconductor device of claim 1, wherein an upper region of the dielectric layer is wider than a lower region of the dielectric layer in the lateral direction.

4. The semiconductor device of claim 1, wherein a lower region of the dielectric layer is disposed entirely over a top surface of the dummy fin.

5. The semiconductor device of claim 1, wherein a lower region of the dielectric layer includes a portion disposed below a top surface of the dummy fin.

6. The semiconductor device of claim 5, wherein the portion of the lower region extends along the sidewall of the dummy fin.

7. The semiconductor device of claim 1, wherein the first sidewall includes a lower portion that is slanted towards and connected to the sidewall of the dummy fin.

8. The semiconductor device of claim 1, wherein the active gate includes a gate dielectric layer traversing both the first sidewall and the second sidewall of the dielectric layer and the sidewall of the dummy fin.

9. The semiconductor device of claim 8, wherein the gate dielectric layer traverses a portion of a top surface of the dummy fin and a portion of a bottom surface of the dielectric layer.

10. A semiconductor device, comprising:
    a substrate;
    an isolation region disposed on the substrate;
    a plurality of fins extending from the substrate and the isolation region, the fins including an active fin and an inactive fin spaced along a lateral direction;
    an active gate disposed over the active fin and the inactive fin; and
    a dielectric layer disposed in a portion of the active gate between the active fin and the inactive fin, the dielectric layer including a first portion landing on a top surface of the inactive fin and a second portion extending along an entirety of a sidewall of the inactive fin above the isolation region.

11. The semiconductor device according to claim 10, wherein the first portion of the dielectric layer partially extends over the top surface of the inactive fin along the lateral direction.

12. The semiconductor device according to claim 11, wherein the active gate contacts the top surface of the inactive fin.

13. The semiconductor device according to claim 10, wherein the first portion of the dielectric layer fully extends over the top surface of the inactive fin along the lateral direction.

14. The semiconductor device according to claim 13, wherein the sidewall is a first sidewall and the inactive fin includes a second sidewall opposite the first sidewall, and wherein the dielectric layer further includes a third portion extending along an entirety of the second sidewall of the inactive fin.

15. The semiconductor device according to claim 13, wherein a bottom surface of the dielectric layer contacts the substrate.

16. The semiconductor device according to claim 13, wherein a width of the first portion of the dielectric layer along the lateral direction is in a range of 2 nm to 150 nm.

17. The semiconductor device according to claim 10, wherein a width of the second portion of the dielectric layer along the lateral direction is in a range of 0.5 nm to 50 nm.

18. A method of forming a semiconductor device, comprising:
    providing a substrate;
    forming a plurality of fins extending from the substrate, the fins including an active fin and an inactive fin spaced along a lateral direction;
    forming isolation regions surrounding bottom portions of the active fin and the inactive fin;
    forming an active gate to engage with the active fin and the inactive fin; and
    forming a dielectric layer extending through the active gate, the dielectric layer including a first portion contacting a top surface of the inactive fin and a second portion extending along an entirety of a sidewall of the inactive fin above the isolation regions.

19. The method of claim 18, wherein:
    the sidewall is a first sidewall,
    the first portion of the dielectric layer contacts an entirety of the top surface of the inactive fin, and
    the dielectric layer further includes a third portion extending along an entirety of a second sidewall opposite the first sidewall above the isolation regions.

20. The method of claim 18, wherein the dielectric layer is formed to directly contact the substrate.

* * * * *